United States Patent
Ren et al.

(10) Patent No.: US 12,296,528 B2
(45) Date of Patent: *May 13, 2025

(54) COMPOSITIONS AND ARTICLES FOR ADDITIVE FABRICATION AND METHODS OF USING THE SAME IN PARTICLE IMAGE VELOCIMETRY TESTING

(71) Applicant: Stratasys, Inc., Eden Prairie, MN (US)

(72) Inventors: Kangtai Ren, Geneva, IL (US); Robin Papachristopoulos, Elgin, IL (US)

(73) Assignee: Stratasys, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/391,760

(22) Filed: Dec. 21, 2023

(65) Prior Publication Data

US 2024/0157627 A1    May 16, 2024

Related U.S. Application Data

(63) Continuation of application No. 17/502,631, filed on Oct. 15, 2021, now Pat. No. 11,878,459, which is a continuation of application No. 16/957,820, filed as application No. PCT/US2018/066346 on Dec. 19, 2018, now Pat. No. 11,180,594.

(60) Provisional application No. 62/612,157, filed on Dec. 29, 2017, provisional application No. 62/619,439, filed on Jan. 19, 2018.

(51) Int. Cl.
| | |
|---|---|
| *C08F 2/46* | (2006.01) |
| *B29C 64/106* | (2017.01) |
| *B33Y 70/10* | (2020.01) |
| *C08F 2/50* | (2006.01) |
| *C08F 220/18* | (2006.01) |
| *C08G 61/04* | (2006.01) |
| *C09B 11/24* | (2006.01) |
| *G01P 5/20* | (2006.01) |
| *B29C 64/135* | (2017.01) |

(52) U.S. Cl.
CPC ............ *B29C 64/106* (2017.08); *B33Y 70/10* (2020.01); *C08F 220/18* (2013.01); *C09B 11/24* (2013.01); *G01P 5/20* (2013.01); *B29C 64/135* (2017.08)

(58) Field of Classification Search
CPC ..... B33Y 70/10; B29C 64/106; B29C 64/135; G03F 7/105; G03F 7/027; G03F 7/0037; G01P 5/20; G01M 9/08; C08F 2/50; C08F 220/18; C08F 222/1006; C08F 222/1025; C08K 5/0041; C09B 11/24
USPC ............ 522/26, 7, 6, 189, 184, 71, 1; 520/1
See application file for complete search history.

(56) References Cited

U.S. PATENT DOCUMENTS

| | | |
|---|---|---|
| 3,708,499 A | 1/1973 | Andree et al. |
| 3,767,358 A | 10/1973 | Stryker |
| 3,849,065 A | 11/1974 | Schmeidl |
| 4,575,330 A | 3/1986 | Hull |
| 5,047,568 A | 9/1991 | Angelo et al. |
| 5,380,923 A | 1/1995 | Wright et al. |
| 5,470,816 A | 11/1995 | Satake et al. |
| 5,665,792 A | 9/1997 | Lawton et al. |
| 6,031,021 A | 2/2000 | Kenny et al. |
| 6,368,769 B1 | 4/2002 | Ohkawa et al. |
| 7,230,122 B2 | 6/2007 | Liu et al. |
| 7,611,817 B2 | 11/2009 | Nakayashiki et al. |
| 7,678,528 B2 | 3/2010 | Rahman et al. |
| 8,617,787 B2 | 12/2013 | Suzuki et al. |
| 8,953,035 B2 | 2/2015 | Fukuchi et al. |
| 9,228,073 B2 | 1/2016 | He et al. |
| 9,962,142 B2 | 5/2018 | Falahatpisheh et al. |
| 11,180,594 B2 * | 11/2021 | Ren ..................... B33Y 70/10 |
| 2003/0149124 A1 | 8/2003 | Thommes et al. |
| 2005/0040562 A1 | 2/2005 | Steinmann et al. |
| 2005/0101684 A1 | 5/2005 | You et al. |
| 2006/0055088 A1 | 3/2006 | Nakayashiki et al. |
| 2006/0242910 A1 | 11/2006 | You |
| 2009/0093564 A1 | 4/2009 | Oyanagi |

(Continued)

FOREIGN PATENT DOCUMENTS

| | | |
|---|---|---|
| EP | 1448654 A1 | 8/2004 |
| EP | 2218715 A1 | 8/2010 |

(Continued)

OTHER PUBLICATIONS

Aycock et al., "Particle image velocimetry measurements in an anatomical vascular model fabricated using inkjet 3D printing," Experiments in Fluid, vol. 58, No. 154, 2017.

(Continued)

*Primary Examiner* — Jessica Whiteley
(74) *Attorney, Agent, or Firm* — Faegre Drinker Biddle & Reath LLP

(57) ABSTRACT

Radiation curable compositions for additive fabrication processes, the components cured therefrom, and their use in particle image velocimetry testing methods are described and claimed herein. Such compositions include compounds which induce free-radical polymerization, optionally compounds which induce cationic polymerization, a filler constituent, and a light absorbing component, wherein the compositions are configured to possess certain absorbance coefficients at wavelengths commonly utilized in particle image velocimetry testing. In another embodiment, the compositions include a fluorantimony-modified compound. Such compositions may be used in particle imaging velocimetry testing methods, wherein the test object utilized is created via additive fabrication and is of a substantially homogeneous construction.

18 Claims, 1 Drawing Sheet

(56) References Cited

U.S. PATENT DOCUMENTS

| | | |
|---|---|---|
| 2009/0182172 A1 | 7/2009 | Kolb et al. |
| 2010/0227941 A1 | 9/2010 | Ueda et al. |
| 2010/0233621 A1 | 9/2010 | Yamamoto et al. |
| 2011/0039205 A1 | 2/2011 | Suzuki et al. |
| 2012/0251829 A1 | 10/2012 | Xu et al. |
| 2012/0251841 A1 | 10/2012 | Southwell et al. |
| 2013/0070062 A1 | 3/2013 | Fouras et al. |
| 2015/0125702 A1 | 5/2015 | He et al. |
| 2017/0145184 A1 | 5/2017 | He et al. |
| 2017/0275414 A1 | 9/2017 | Kwisnek et al. |
| 2018/0264719 A1 | 9/2018 | Rolland et al. |
| 2020/0223992 A1* | 7/2020 | Cushen .................. B33Y 70/00 |
| 2022/0033553 A1 | 2/2022 | Ren et al. |

FOREIGN PATENT DOCUMENTS

| | | |
|---|---|---|
| EP | 2308865 A1 | 4/2011 |
| EP | 2868692 A1 | 5/2015 |
| JP | 2006-348214 A | 12/2006 |
| JP | 2017-036349 A | 2/2017 |
| WO | 2005/045525 A1 | 5/2005 |
| WO | 2010/046240 A1 | 4/2010 |
| WO | 2017/044381 A1 | 3/2017 |
| WO | 2017/059222 A1 | 4/2017 |
| WO | 2017/087614 A1 | 5/2017 |
| WO | 2018/119049 A1 | 6/2018 |

OTHER PUBLICATIONS

International Preliminary Report on Patentability received for PCT Patent Application No. PCT/US2018/066346, mailed on Jul. 9, 2020, 10 pages.

International Search Report and Written Opinion received for PCT Patent Application No. PCT/US2018/066346, mailed on May 27, 2019, 13 pages.

Olasek et al., "Application of 3D printing technology in aerodynamic study," Journal of Physics: Conference Series, vol. 530, 2014.

* cited by examiner

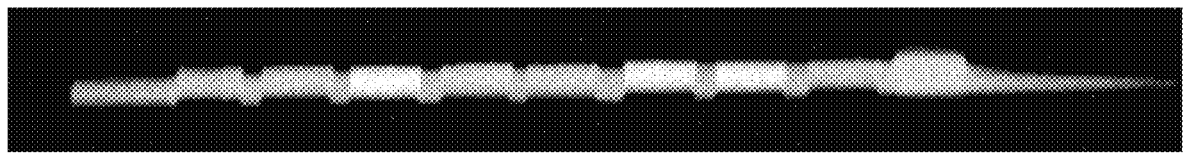

COMPOSITIONS AND ARTICLES FOR ADDITIVE FABRICATION AND METHODS OF USING THE SAME IN PARTICLE IMAGE VELOCIMETRY TESTING

CROSS-REFERENCE TO RELATED APPLICATIONS

This application is a continuation application of U.S. application Ser. No. 17/502,631, filed Oct. 15, 2021, which is continuation of U.S. application Ser. No. 16/957,820, filed Jun. 25, 2020, which is a National stage application (under 35 U.S.C. § 371) of PCT/US2018/066346, filed Dec. 19, 2018, which claims benefit of U.S. Application Nos. 62/612,157, and 62/619,439, filed Dec. 29, 2017 and Jan. 19, 2018, respectively, all of which are incorporated by reference in their entirety.

TECHNICAL FIELD

The present invention relates to radiation curable compositions for additive fabrication processes, the components cured therefrom, and their use in particle image velocimetry testing methods.

BACKGROUND

Additive fabrication processes for producing three dimensional objects are well known. Additive fabrication processes utilize computer-aided design (CAD) data of an object to build three-dimensional parts. These three-dimensional parts may be formed from liquid resins, powders, or other materials.

A non-limiting example of an additive fabrication process is stereolithography (SL). Stereolithography is a well-known process for rapidly producing models, prototypes, patterns, and production parts in certain applications. SL uses CAD data of an object wherein the data is transformed into thin cross-sections of a three-dimensional object. The data is loaded into a computer which controls a laser that traces a pattern of a cross section through a liquid radiation curable resin composition contained in a vat, solidifying a thin layer of the resin corresponding to the cross section. The solidified layer is recoated with resin and the laser traces another cross section to harden another layer of resin on top of the previous layer. The process is repeated layer by layer until the three-dimensional object is completed. When initially formed, the three-dimensional object is, in general, not fully cured, and is called a "green model." Although not required, the green model may be subjected to post-curing to enhance the mechanical properties of the finished part. An example of an SL process is described in U.S. Pat. No. 4,575,330, which is hereby incorporated by reference.

There are several types of lasers used in stereolithography, traditionally ranging from 193 nm to 355 nm in wavelength, although other wavelength variants exist. The use of gas lasers to cure liquid radiation curable resin compositions is well known. The delivery of laser energy in a stereolithography system can be Continuous Wave (CW) or Q-switched pulses. CW lasers provide continuous laser energy and can be used in a high speed scanning process. However, their output power is limited which reduces the amount of curing that occurs during object creation. As a result the finished object will need additional post process curing. In addition, excess heat could be generated at the point of irradiation which may be detrimental to the resin. Further, the use of a laser requires scanning point by point on the resin which can be time-consuming.

Other methods of additive fabrication utilize lamps or light emitting diodes (LEDs). LEDs are semiconductor devices which utilize the phenomenon of electroluminescence to generate light. At present, LED UV light sources currently emit light at wavelengths between 300 and 475 nm, with 365 nm, 390 nm, 395 nm, 405 nm, and 415 nm being common peak spectral outputs. See textbook, "Light-Emitting Diodes" by E. Fred Schubert, 2nd Edition, @ E. Fred Schubert 2006, published by Cambridge University Press, for a more in-depth discussion of LED UV light sources.

Many additive fabrication applications require a freshly-cured part, aka the "green model" to possess high mechanical strength (modulus of elasticity, fracture strength). This property, often referred to as "green strength," constitutes an important property of the green model and is determined essentially by the nature of the liquid radiation curable resin composition employed in combination with the type of apparatus used and degree of exposure provided during part fabrication. Other important properties of a stereolithographic resin composition include a high sensitivity for the radiation employed in the course of curing and a minimum amount of curl or shrinkage deformation, permitting high shape definition of the green model. Of course, not only the green model but also the final cured article should have sufficiently optimized mechanical properties.

For select additive fabrication applications in the aerospace or automotive industries, for example, three-dimensional solid parts are subjected to the high force loads of a wind tunnel, or the extreme temperatures of a location proximate to heat-generating componentry. In such applications, designers and engineers require a three-dimensional solid part created via additive fabrication to maintain its structural integrity and minimize deflection. Thus three-dimensional parts made from photopolymerizable compositions must possess ceramic-like material properties, such as high strength, stiffness, and heat resistance.

"Filled" liquid radiation curable resins have long been used in the field in an attempt to meet these specialized application design criteria. That is, high amounts of inorganic filler, such as silica ($SiO_2$) have been imparted into traditional "unfilled" liquid radiation curable resins due to the filler's positive impact on the strength and stiffness of the three-dimensional object produced therefrom. Such filled liquid radiation curable compositions are known in the art of additive fabrication, and are disclosed in, e.g., U.S. Pat. No. 9,228,073, assigned to DSM IP Assets, B. V.

As noted, highly filled stereolithography (SL) products produce strong, stiff, high temperature resistant composite parts that have been widely utilized in wind tunnel testing. Over the past years, certain post-processed highly filled parts created via SL have been extensively used in particle image velocimetry (PIV) in the wind tunnel and boost their R&D efficiency. Before a PIV test, SL parts are specially prepared to reduce surface reflection when hit by the high intensity green laser. It usually takes hours or days to get them ready, and surface treatment of SL parts sometimes may be intrusive and fragile to PIV test conditions and environment.

Particle image velocimetry (PIV) is a quantitative method which uses a combination of a high intensity light source, digital cameras, and seed particles commonly known as tracers to provide an accurate velocity measurement of the flow field being studied. The flow is typically seeded with neutrally buoyant particles which closely represents the fluid. A bright light, such as from a high-powered laser, is then used in conjunction with one or more digital cameras to collect two images with a small separation time. These images are then either cross-correlated or auto-correlated, and the resulting calculations yield velocity vectors. PIV may be said to be a consequence of the development of flow visualization techniques, which have contributed so importantly to the understanding of fluid flow phenomena. Flow visualization probably always played an important role in the study of fluid motion.

PIV testing has been used to facilitate improvements in aerodynamic designs of racing cars since at least 2006. Such tests were used in wind-tunnel applications to facilitate the visualization of air flow behavior and to study the aerodynamic effect of SL-fabricated car parts. As such, permanent PIV test equipment have been affixed to wind tunnels for at least 10 years in Formula 1. Over the past decade, racing engineers have used such systems intensively to boost R&D efficiency to produce cars with ever-increasing amounts of downforce.

PIV has played a major role in race car innovation. One example is that it has allowed design engineers to accurately measure the front wheel's wake, something that was pivotal for a car's performance. Engineers wanted to study the wake behind the front wheels of a vehicle, as it is a critical part of the flow. If not perfectly calibrated, the performance of the entire vehicle could be severely compromised. After being presented with the problem, the team realized they needed to look at options for adding or modifying various front-end parts, like an under-nose turning vane or the front wing, to create or influence an outwash, which pushes the flow from underneath the nose of the car, forcing the wake of the car as outward as possible.

A common concern during PIV testing is surface reflection produced by the high intensity laser necessarily used therein. The severity of the reflection is influenced partially by the material being used, the intensity of the light source, and the application of image filtering. The material selected can have a predominant effect on the severity of the surface reflection. The high surface reflection alters the PIV test data near the surface of the part, making the image appear blurred. Engineers could not directly apply SL parts for PIV testing due to the highly reflective surface. Engineers usually post-treat the surface of SL parts by wrapping up parts with special metal foil or painting the surface of the parts, to ensure they work well in the PIV test. The post treatment is time-consuming, from hours up to days, and usually creates new issues depending on treatment method. Painting SL parts is currently the most popular treatment. The first step is to eliminate all surface imperfections by sanding SL parts. Then, a coating of matte black paint or orange paint is typically sprayed onto the surface and allowed to dry. The paint usually contains hazardous chemicals, and the uniformity of paint thickness is difficult to control when the shape or geometry of SL parts becomes complicated. The paint layer can sometimes partially wear off during testing or handling. Despite the years of SL parts being used in such PIV tests, heretofore none exist which eliminate the need for time-consuming post processing involving potentially hazardous chemicals and which compromise the accuracy of the precisely fabricated SL part.

From the foregoing, it is evident that no radiation curable compositions for additive fabrication exist that are suitable for producing cured components having adequate application-specific heat resistance and structural rigidity, while simultaneously overcoming the long-felt but unsolved industry needs of providing a resin which is capable of producing parts that enable PIV testing without need for post-processing, and yet are still sufficiently fast-curing to be suitable for use in additive fabrication processes, such as stereolithography.

BRIEF SUMMARY

A first aspect of the claimed invention is a process of performing a particle imaging velocimetry test using an object created via additive fabrication, the method comprising:
  providing a test component created via additive fabrication; immersing the test component in a flow field seeded with tracer particles;
  illuminating at least a portion of said seeded flow field proximate to said component with light of a first wavelength;
  capturing a plurality of images using an imaging system; evaluating said images to determine flow vectors proximate to the test component;
  wherein the test component is of a substantially homogeneous construction.

A second aspect of the claimed invention is a radiation curable composition for additive fabrication, comprising:
  a free-radically polymerizable component;
  a free-radical photoinitiator;
  a filler constituent;
  and a light absorbing component;
  wherein the composition is configured to possess an absorbance coefficient at 532 nm of at least 10, or at least 15, or at least 20, or at least 25, or at least 30, or from 10-1000, or from 15-500, or from 20-200, or from 25-150, or from 30-100, or from 30-80, or from 35-75.

A third aspect of the claimed invention is a radiation curable composition for additive fabrication, comprising, relative to the weight of the entire composition:
  a. from 25-65 wt. % of a filler constituent;
  b. from 10-50 wt. % of a cationically polymerizable constituent;
  c. from 5-40 wt. % of a free-radically polymerizable constituent;
  d. an effective amount of a cationic photoinitiator;
  e. an effective amount of a free-radical photoinitiator; and
  f. a fluorantimony-modified compound that is different from (d).

BRIEF DESCRIPTION OF THE DRAWINGS

FIG. 1 depicts the relative reflectance of various sample objects created via additive fabrication processes when subjected to a laser used in particle image velocimetry testing.

DETAILED DESCRIPTION

As used herein, "substantially homogeneous construction" means an object that is of a substantially uniform appearance and composition. For purposes herein, components created via vat-based additive fabrication processes, such as stereolithography, are considered to be of a "substantially homogeneous construction," even if such parts are the cured product of resins comprising a mixture of liquid resin and solid inorganic filler particles (such as nanosilica) dispersed therein. Examples of objects that would not, for purposes herein, be considered to be of a "substantially homogeneous construction," include parts which are post-processed by painting the cured object, or those to which a metal foil is affixed to at least a portion of the exterior surface of the cured object.

A first aspect of the claimed invention is a process of performing a particle imaging velocimetry test using an object created via additive fabrication, the method comprising:
   providing a test component created via additive fabrication; immersing the test component in a flow field seeded with tracer particles;
   illuminating at least a portion of said seeded flow field proximate to said component with light of a first wavelength;
   capturing a plurality of images using an imaging system; evaluating said images to determine flow vectors proximate to the test component;
   wherein the test component is of a substantially homogeneous construction.

A second aspect of the claimed invention is a radiation curable composition for additive fabrication, comprising:
   a free-radically polymerizable component;
   a free-radical photoinitiator;
   a filler constituent;
   and a light absorbing component;
   wherein the composition is configured to possess an absorbance coefficient at 532 nm of at least 10, or at least 15, or at least 20, or at least 25, or at least 30, or from 10-1000, or from 15-500, or from 20-200, or from 25-150, or from 30-100, or from 30-80, or from 35-75.

A third aspect of the claimed invention is a radiation curable composition for additive fabrication, comprising, relative to the weight of the entire composition:
   a. from 25-65 wt. % of a filler constituent;
   b. from 10-50 wt. % of a cationically polymerizable constituent;
   c. from 5-40 wt. % of a free-radically polymerizable constituent;
   d. an effective amount of a cationic photoinitiator;
   e. an effective amount of a free-radical photoinitiator; and
   f. a fluorantimony-modified compound that is different from (d).

Cationically Polymerizable Component

In accordance with an embodiment, the liquid radiation curable resins for additive fabrication of the invention comprise at least one cationically polymerizable component; that is a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Suitable cationically polymerizable components include cyclic ether compounds such as epoxy compounds and oxetanes, cyclic lactone compounds, cyclic acetal compounds, cyclic thioether compounds, spiro orthoester compounds, and vinylether compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl) adipate, vinylcyclohexene oxide, 4-vinylepoxycyclohexane, vinylcyclohexene dioxide, limonene oxide, limonene dioxide, bis(3,4-epoxy-6-methylcyclohexylmethyl) adipate, 3,4-epoxy-6-methylcyclohexyl-3', 4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —$SO_2$—, —$C(CH_3)_2$—, —$CBr_2$—, —$C(CBr_3)_2$—, —$C(CF_3)_2$—, $C(CCl_3)_2$—, or —$CH(C_6H_5)$—, dicyclopentadiene diepoxide, di(3,4-epoxycyclohexylmethyl) ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl] benzene, 3-ethyl-3-hydroxymethyloxetane, 3-ethyl-3-(3-hydroxypropyl)oxymethyloxetane, 3-ethyl-3-(4-hydroxybutyl) oxymethyloxetane, 3-ethyl-3-(5-hydroxypentyl) oxymethyloxetane, 3-ethyl-3-phenoxymethyloxetane, bis ((1-ethyl(3-oxetanyl))methyl) ether, 3-ethyl-3-((2-ethylhexyloxy)methyl) oxetane, 3-ethyl-((triethoxysilylpropoxymethyl) oxetane, 3-(meth)-allyloxymethyl-3-ethyloxetane, 3-hydroxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl (3-ethyl-3-oxetanylmethyl) ether, 2-ethylhexyl(3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl(3-ethyl-3-oxetanylmethyl) ether, tetrahydrofurfuryl(3-ethyl-3-oxetanylmethyl) ether, 2-hydroxyethyl(3-ethyl-3-oxetanylmethyl) ether, 2-hydroxypropyl(3-ethyl-3-oxetanylmethyl) ether, and any combination thereof.

The cationically polymerizable component may optionally also contain polyfunctional materials including dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In an embodiment, the composition of the present invention also comprises one or more mono or poly glycidylethers of aliphatic alcohols, aliphatic polyols, polyesterpolyols or polyetherpolyols. Examples of preferred components include 1,4-butanedioldiglycidylether, glycidylethers of polyoxyethylene and polyoxypropylene glycols and triols of molecular weights from about 200 to about 10,000; glycidylethers of polytetramethylene glycol or poly(oxyethylene-oxybutylene) random or block copolymers. In a specific embodiment, the cationically polymerizable component comprises a polyfunctional glycidylether that lacks a cyclohexane ring in the molecule. In another specific embodiment, the cationically polymerizable component includes a neopentyl glycol diglycidyl ether. In another specific embodiment, the cationically polymerizable component includes a 1,4 cyclohexanedimethanol diglycidyl ether.

Examples of commercially available preferred polyfunctional glycidylethers are Erisys™ GE 22 (Erisys™ products are available from Emerald Performance Materials™), Heloxy™ 48, Heloxy™ 67, Heloxy™ 68, Heloxy™ 107 (Heloxy™ modifiers are available from Momentive Specialty Chemicals), and Grilonit® F713. Examples of commercially available preferred monofunctional glycidylethers are Heloxy™ 71, Heloxy™ 505, Heloxy™ 7, Heloxy™ 8, and Heloxy™ 61.

In an embodiment, the epoxide is 3,4-epoxycyclohexyl-methyl-3',4-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPON™ 1510 from Momentive), 1,4-cyclohexanedimethanol diglycidyl ether (available as HELOXY™ 107 from Momentive), a hydrogenated bisphenol A diglycidyl ether (available as EPON™ 825 from Momentive) a mixture of dicyclohexyl diepoxide and nanosilica (available as NANOPOX™), and any combination thereof.

The above-mentioned cationically polymerizable compounds can be used singly or in combination of two or more thereof. In embodiments of the invention, the cationic polymerizable component further comprises at least two different epoxy components. In a specific embodiment, the cationic polymerizable component includes a cycloaliphatic epoxy, for example, a cycloaliphatic epoxy with 2 or more than 2 epoxy groups. In another specific embodiment, the cationic polymerizable component includes an epoxy having an aromatic or aliphatic glycidyl ether group with 2 (difunctional) or more than 2 (polyfunctional) epoxy groups.

The liquid radiation curable resin for additive fabrication can therefore include suitable amounts of the cationic polymerizable component, for example, in certain embodiments, in an amount from about 10 to about 80% by weight of the resin composition, in further embodiments from about 20 to about 70 wt % of the resin composition, and in further embodiments from about 25 to about 65 wt % of the resin composition.

In other embodiments of the invention, the cationic polymerizable component also optionally comprises an oxetane component. In a specific embodiment, the cationic polymerizable component includes an oxetane, for example, an oxetane containing 1, 2 or more than 2 oxetane groups. If utilized in the composition, the oxetane component is present in a suitable amount from about 5 to about 30 wt % of the resin composition. In another embodiment, the oxetane component is present in an amount from about 10 to about 25 wt % of the resin composition, and in yet another embodiment, the oxetane component is present in an amount from 20 to about 30 wt % of the resin composition.

In accordance with an embodiment, the liquid radiation curable resin composition for additive fabrication contains a component that is polymerizable by both free-radical polymerization and cationic polymerization. An example of such a polymerizable component is a vinyloxy compound, for example, one selected from the group consisting of bis(4-vinyloxybutyl) isophthalate, tris(4-vinyloxybutyl) trimellitate, and combinations thereof. Other examples of such a polymerizable component include those containing an acrylate and an epoxy group, or an acrylate and an oxetane group, on a same molecule.

Radically Polymerizable Component

In accordance with an embodiment of the invention, the liquid radiation curable resin for additive fabrication of the invention comprises at least one free-radical polymerizable component, that is, a component which undergoes polymerization initiated by free radicals. The free-radical polymerizable components are monomers, oligomers, and/or polymers; they are monofunctional or polyfunctional materials, i.e., have 1, 2, 3, 4, 5, 6, 7, 8, 9, 10 . . . 20 . . . 30 . . . 40 . . . 50 . . . 100, or more functional groups that can polymerize by free radical initiation, may contain aliphatic, aromatic, cycloaliphatic, arylaliphatic, heterocyclic moiety (ies), or any combination thereof. Examples of polyfunctional materials include dendritic polymers such as dendrimers, linear dendritic polymers, dendrigraft polymers, hyperbranched polymers, star branched polymers, and hypergraft polymers; see, e.g., US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl (meth)acrylate, bornyl(meth)acrylate, tricyclodecanyl(meth)acrylate, dicyclopentanyl (meth)acrylate, dicyclopentenyl(meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth)acrylate, undecyl (meth)acrylate, lauryl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate.

Examples of polyfunctional free-radical polymerizable components include those with (meth)acryloyl groups such as trimethylolpropane tri (meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro [5.5]undecane di(meth)acrylate; dipentaerythritol monohydroxypenta (meth)acrylate, propoxylated trimethylolpropane tri (meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri (meth)acrylate, phosphoric acid mono- and di(meth)acrylates, $C_7$-$C_{20}$ alkyl di(meth)acrylates, tris(2-hydroxyethyl) isocyanurate tri (meth)acrylate, tris(2-hydroxyethyl) isocyanurate di(meth)acrylate, pentaerythritol tri (meth)acrylate, pentaerythritol tetra(meth)acrylate, dipentaerythritol hexa(meth)crylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the radically polymerizable component is a polyfunctional (meth)acrylate. The polyfunctional (meth)acrylates may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth) acrylate, [2-[1,1-dimethyl-2-[(1-oxoallyl)oxy]ethyl]-5-ethyl-1,3-dioxan-5-yl]methyl acrylate, dipentaerythritol monohydroxypenta (meth)acrylate, dipentaerythritol penta (meth)acrylate, dipentaerythritol hexa(meth)acrylate, propoxylated trimethylolpropane tri (meth)acrylate, and propoxylated neopentyl glycol di(meth)acrylate, and any combination thereof.

In a preferred embodiment, the polyfunctional (meth) acrylate has more than 2, more preferably more than 3, and more preferably greater than 4 functional groups.

In another preferred embodiment, the radically polymerizable component consists exclusively of a single polyfunctional (meth)acrylate component. In further embodiments, the exclusive radically polymerizable component is tetra-functional, in further embodiments, the exclusive radically polymerizable component is penta-functional, and in further embodiments, the exclusive radically polymerizable component is hexa-functional.

In another embodiment, the free-radical polymerizable component is selected from the group consisting of bisphenol A diglycidyl ether diacrylate, dicyclopentadiene dimethanol diacrylate, [2-[1,1-dimethyl-2-[(1-oxoallyl)oxy] ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof.

In specific embodiments, the liquid radiation curable resins for additive fabrication of the invention include one or more of bisphenol A diglycidyl ether di(meth)acrylate, dicyclopentadiene dimethanol di(meth)acrylate, dipentaerythritol monohydroxypenta (meth)acrylate, propoxylated trimethylolpropane tri (meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol pentaacrylate, propoxylated trimethylolpropane triacrylate, and/or propoxylated neopentyl glycol diacrylate.

The above-mentioned radically polymerizable compounds can be used singly or in combination of two or more thereof. The liquid radiation curable resin for additive fabrication can include any suitable amount of the free-radical polymerizable components, for example, in certain embodiments, in an amount up to about 40 wt % of the resin composition, in certain embodiments, from about 2 to about 40 wt % of the resin composition, in other embodiments from about 5 to about 30 wt %, and in further embodiments from about 10 to about 20 wt % of the resin composition.

Hydroxy Functional Components

Many of the known liquid radiation curable resin compositions for additive fabrication use hydroxy-functional compounds to enhance the properties of the parts made from the resin compositions.

In certain embodiments of the invention, the resin composition may optionally contain a hydroxy-functional component. The hydroxyl-containing material which can be used in the present invention may be any suitable organic material having a hydroxyl functionality of at least 1. If present, the material is preferably substantially free of any groups which interfere with the curing reactions or which are thermally or photolytically unstable.

If present, any hydroxy group may be employed for the particular purpose. If present, the hydroxyl-containing material preferably contains one or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000.

Representative examples of hydroxyl-containing materials having a hydroxyl functionality of 1 include alkanols, monoalkyl ethers of polyoxyalkyleneglycols, monoalkyl ethers of alkyleneglycols, and others, and combinations thereof.

Representative examples of monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(–)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of oligomeric and polymeric hydroxyl-containing materials include polyoxyethylene and polyoxypropylene glycols and triols of molecular weights from about 200 to about 10,000; polytetramethylene glycols of varying molecular weight; poly (oxyethylene-oxybutylene) random or block copolymers; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

If present, preferred hydroxyl-containing monomers include 1,4-cyclohexanedimethanol and aliphatic and cycloaliphatic monohydroxy alkanols. Such preferred hydroxyl-containing oligomers and polymers include hydroxyl and hydroxyl/epoxy functionalized polybutadiene, polycaprolactone diols and triols, ethylene/butylene polyols, and monohydroxy functional monomers. Preferred examples of polyether polyols are polypropylene glycols of various molecular weights and glycerol propoxylate-B-ethoxylate triol. If present, especially preferred are linear and branched polytetrahydrofuran polyether polyols available in various molecular weights, such as in the range of 150-4000 g/mol, preferably in the range of 150-1500 g/mol, more preferably in the range of 150-750 g/mol.

If present, the resin composition preferably comprises, relative to the total weight of the resin composition, at most 10 wt % of one or more non-free radical polymerizable hydroxy-functional compounds, more preferably at most 5 wt %, and most preferably at most 2 wt %.

In embodiments, the liquid radiation curable resin for additive fabrication of the present invention includes a photoinitiating system. The photoinitiating system can include a free-radical photoinitiator and/or a cationic photoinitiator. In accordance with an embodiment, the liquid radiation curable resin composition includes a photoinitiating system contains at least one photoinitiator having a cationic initiating function, and at least one photoinitiator having a free radical initiating function. Additionally, the photoinitiating system can include a photoinitiator that contains both free-radical initiating function and cationic initiating function on the same molecule. The photoinitiator is a compound that chemically changes due to the action of light or the synergy between the action of light and the electronic excitation of a sensitizing dye to produce at least one of a radical, an acid, and a base.

Cationic Photoinitiator

In accordance with an embodiment, the liquid radiation curable resin composition includes a cationic photoinitiator. The cationic photoinitiator initiates cationic ring-opening polymerization upon irradiation of light.

In an embodiment, any suitable cationic photoinitiator can be used, for example, those with cations selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, ferrocenes, di(cyclopentadienyliron) arene salt compounds, and pyridinium salts, and any combination thereof.

In another embodiment, the cation of the cationic photoinitiator is selected from the group consisting of aromatic diazonium salts, aromatic sulfonium salts, aromatic iodonium salts, metallocene based compounds, aromatic phosphonium salts, and any combination thereof. In another embodiment, the cation is a polymeric sulfonium salt, such as in U.S. Pat. No. 5,380,923 or U.S. Pat. No. 5,047,568, or other aromatic heteroatom-containing cations and naphthyl-sulfonium salts such as in U.S. Pat. Nos. 7,611,817, 7,230,122, US2011/0039205, US2009/0182172, U.S. Pat. No. 7,678,528, EP2308865, WO2010046240, or EP2218715. In another embodiment, the cationic photoinitiator is selected from the group consisting of triarylsulfonium salts, diaryliodonium salts, and metallocene based compounds, and any combination thereof. Onium salts, e.g., iodonium salts and sulfonium salts, and ferrocenium salts, have the advantage that they are generally more thermally stable.

In a particular embodiment, the cationic photoinitiator has an anion selected from the group consisting of $BF_4^-$, $AsF_6^-$, $SbF_6^-$, $PF_6^-$, $[B(CF_3)_4]^-$, $B(C_6F_5)_4^-$, $B[C_6H_3-3,5\ (CF_3)_2]_4^-$, $B(C_6H_4CF_3)_4^-$, $B(C_6H_3F_2)_4$, $B[C_6F_4-4(CF_3)]_4^-$, $Ga(C_6F_5)_4$, $[(C_6F_5)_3B—C_3H_3N_2—B(C_6F_5)_3]$, $[(C_6F_5)_3B—NH_2—B(C_6F_5)_3]$, tetrakis (3,5-difluoro-4-alkyloxyphenyl) borate, tetrakis (2,3,5,6-tetrafluoro-4-alkyloxyphenyl) borate, perfluoroalkylsulfonates, tris[(perfluoroalkyl) sulfonyl]methides, bis[(perfluoroalkyl) sulfonyl]imides, perfluoroalkylphosphates, tris(perfluoroalkyl) trifluorophosphates, bis (perfluoroalkyl) tetrafluorophosphates, tris (pentafluoroethyl) trifluorophosphates, and $(CH_6B_{11}Br_6)$, $(CH_6B_{11}Cl_6)$ and other halogenated carborane anions.

A survey of other onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring).

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, $[B(CF_3)_4]^-$, tetrakis (3,5-difluoro-4-methoxyphenyl) borate, perfluoroalkylsulfonates, perfluoroalkylphosphates, tris[(perfluoroalkyl) sulfonyl]methides, and $[(C_2F_5)_3PF_3]$.

Examples of cationic photoinitiators useful for curing at 300-475 nm, particularly at 365 nm UV light, without a sensitizer include 4-[4-(3-chlorobenzoyl)phenylthio]phenylbis (4-fluorophenyl) sulfonium hexafluoroantimonate, 4-[4-(3-chlorobenzoyl)phenylthio]phenylbis (4-fluorophenyl) sulfonium tetrakis (pentafluorophenyl) borate, 4-[4-(3-chlorobenzoyl)phenylthio]phenylbis (4-fluorophenyl) sulfonium tetrakis (3,5-difluoro-4-methyloxyphenyl) borate, 4-[4-(3-chlorobenzoyl)phenylthio]phenylbis (4-fluorophenyl) sulfonium tetrakis (2,3,5,6-tetrafluoro-4-methyloxyphenyl) borate, tris(4-(4-acetylphenyl)thiophenyl) sulfonium tetrakis (pentafluorophenyl) borate (Irgacure® PAG 290 from BASF), tris(4-(4-acetylphenyl)thiophenyl) sulfonium tris [(trifluoromethyl) sulfonyl]methide (Irgacure® GSID 26-1 from BASF), tris(4-(4-acetylphenyl)thiophenyl) sulfonium hexafluorophosphate (Irgacure® 270 from BASF), and HS-1 available from San-Apro Ltd.

Preferred cationic photoinitiators include, either alone or in a mixture: bis[4-diphenylsulfoniumphenyl]sulfide bishexafluoroantimonate; thiophenoxyphenylsulfonium hexafluoroantimonate (available as Chivacure 1176 from Chitec), tris(4-(4-acetylphenyl)thiophenyl) sulfonium tetrakis (pentafluorophenyl) borate (Irgacure® PAG 290 from BASF), tris(4-(4-acetylphenyl)thiophenyl) sulfonium tris [(trifluoromethyl) sulfonyl]methide (Irgacure® GSID 26-1 from BASF), and tris(4-(4-acetylphenyl)thiophenyl) sulfonium hexafluorophosphate (Irgacure® 270 from BASF), [4-(1-methylethyl)phenyl](4-methylphenyl) iodonium tetrakis (pentafluorophenyl) borate (available as Rhodorsil 2074 from Rhodia), 4-[4-(2-chlorobenzoyl)phenylthio]phenylbis (4-fluorophenyl) sulfonium hexafluoroantimonate (as SP-172 from Adeka), SP-300 from Adeka, and aromatic sulfonium salts with anions of $(PF_{6-m}(C_nF_{2n-1})_m)^-$ where m is an integer from 1 to 5, and n is an integer from 1 to 4 (available as CPI-200K or CPI-200S, which are monovalent sulfonium salts from San-Apro Ltd., TK-1 available from San-Apro Ltd., or HS-1 available from San-Apro Ltd.).

In various embodiments, the liquid radiation curable resin composition for additive fabrication may be irradiated by laser or LED light operating at any wavelength in either the UV or visible light spectrum. In particular embodiments, the irradiation is from a laser or LED emitting a wavelength of from 340 nm to 415 nm. In particular embodiments, the laser or LED source emits a peak wavelength of about 340 nm, 355 nm, 365 nm, 375 nm, 385 nm, 395 nm, 405 nm, or 415 nm.

In an embodiment of the invention, the liquid radiation curable resin for additive fabrication comprises an aromatic triaryl sulfonium salt cationic photoinitiator.

Use of aromatic triaryl sulfonium salts in additive fabrication applications is known. Please see US20120251841 to DSM IP Assets, B.V. (which is hereby incorporated in its entirety), U.S. Pat. No. 6,368,769, to Asahi Denki Kogyo, which discusses aromatic triaryl sulfonium salts with tetraryl borate anions, including tetrakis (pentafluorophenyl) borate, and use of the compounds in stereolithography applications. Triarylsulfonium salts are disclosed in, for example, J Photopolymer Science & Tech (2000), 13 (1), 117-118 and J Poly Science, Part A (2008), 46 (11), 3820-29. Triarylsulfonium salts $Ar_3S^+MXn^-$ with complex metal halide anions such as $BF_4^-$, $AsF_6^-$, $PF_6^-$, and $SbF_6^-$, are disclosed in J Polymer Sci, Part A (1996), 34(16), 3231-3253.

The use of aromatic triaryl sulfonium salts as the cationic photoinitiator in liquid radiation curable resins is desirable in additive fabrication processes because the resulting resin attains a fast photospeed, good thermal-stability, and good photo-stability.

In a preferred embodiment, the cationic photoinitiator is an aromatic triaryl sulfonium salt that is more specifically an R-substituted aromatic thioether triaryl sulfonium tetrakis (pentafluorophenyl) borate cationic photoinitiator, having a tetrakis (pentafluorophenyl) borate anion and a cation of the following formula (I):

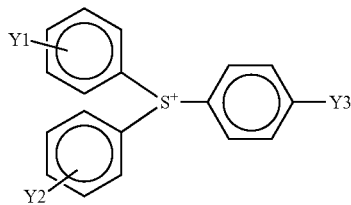

I wherein Y1, Y2, and Y3 are the same or different and wherein Y1, Y2, or Y3 are R-substituted aromatic thioether with R being an acetyl or halogen group.

In an embodiment, Y1, Y2, and Y3 are the same. In another embodiment, Y1 and Y2 are the same, but Y3 is different. In another embodiment, Y1, Y2, or Y3 are an R-substituted aromatic thioether with R being an acetyl or halogen group. Preferably Y1, Y2, or Y3 are a para-R-substituted aromatic thioether with R being an acetyl or halogen group.

A particularly preferred R-substituted aromatic thioether triaryl sulfonium tetrakis (pentafluorophenyl) borate cationic photoinitiator is tris(4-(4-acetylphenyl)thiophenyl) sulfonium tetrakis (pentafluorophenyl) borate. Tris (4-(4-acetylphenyl)thiophenyl) sulfonium tetrakis (pentafluorophenyl) borate is known commercially as IRGACURE® PAG-290 (formerly known by the development code GSID4480-1) and is available from Ciba/BASF.

An R-substituted aromatic thioether triaryl sulfonium tetrakis (pentafluorophenyl) borate cationic photoinitiator, for instance, tris(4-(4-acetylphenyl)thiophenyl) sulfonium tetrakis (pentafluorophenyl) borate, is also more thermally-stable than some other cationic photoinitiators. The improved thermal-stability allows liquid radiation curable resins for additive fabrication incorporating a triaryl sulfonium tetrakis (pentafluorophenyl) borate cationic photoinitiator instead of other conventional cationic photoinitiators to retain their viscosity at elevated temperatures for long periods of time.

In another embodiment, the cationic photoinitiator is an aromatic triaryl sulfonium salt that possesses an anion represented by $SbF_6^-$, $PF_6^-$, $BF_4^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate, and a cation of the following formula (II):

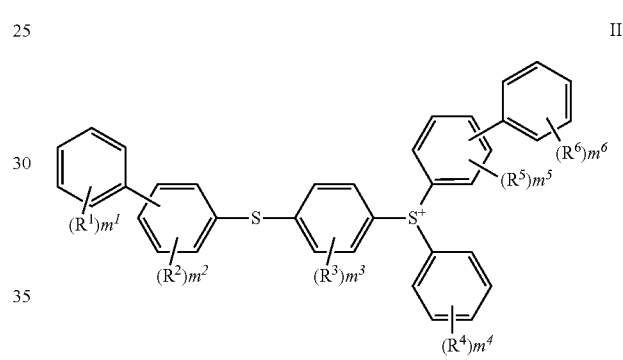

II wherein in formula (II), $R^1$, $R^2$, $R^3$, $R^5$ and $R^6$ each independently represent an alkyl group, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy (poly)alkyleneoxy group, an optionally substituted amino group, a cyano group, a nitro group, or a halogen atom, $R^4$ represents an alkyl group, a hydroxy group, an alkoxy group, an alkylcarbonyl group, an alkoxycarbonyl group, an acyloxy group, an alkylthio group, a heterocyclic hydrocarbon group, an alkylsulfinyl group, an alkylsulfonyl group, a hydroxy (poly)alkyleneoxy group, an optionally substituted amino group, a cyano group, a nitro group, or a halogen atom, $m^1$ to $m^6$ each represent the number of occurrences of each of $R^1$ to $R^6$, $m^1$, $m^4$, and $m^6$ each represent an integer of 0 to 5, $m^2$, $m^3$, and $m^5$ each represent an integer of 0 to 4. Such photoinitiators are described in, for example, U.S. Pat. No. 8,617,787.

A particularly preferred aromatic triaryl sulfonium cationic photoinitiator has an anion that is a fluoroalkyl-substituted fluorophosphate. Commercial examples of an aromatic triaryl sulfonium cationic photoinitiator having a fluoroalkyl-substituted fluorophosphate anion is the CPI-200 series (for example CPI-200K® or CPI-210S®) or 300 series, available from San-Apro Limited.

In accordance with embodiments of the invention, the liquid radiation curable resin for additive fabrication includes a cationic polymerizable component in addition to an R-substituted aromatic thioether triaryl sulfonium tetrakis (pentafluorophenyl) borate or fluoroalkyl-substituted fluorophosphate cationic photoinitiator. In other embodiments, the liquid radiation curable resins for additive fabrication include cationic polymerizable components, free-radical photoinitiators, and free-radical polymerizable components. In some embodiments, the liquid radiation curable resins for additive fabrication include an R-substituted aromatic thioether triaryl sulfonium tetrakis (pentafluorophenyl) borate cationic photoinitiator and additional cationic photoinitiators and/or photosensitizers, along with a cationic polymerizable component and, optionally, free-radical polymerizable components and free-radical photoinitiators.

The liquid radiation curable resin composition can include any suitable amount of the cationic photoinitiator, for example, in certain embodiments, in an amount up to about 15% by weight of the resin composition, in certain embodiments, up to about 5% by weight of the resin composition, and in further embodiments from about 2% to about 10% by weight of the resin composition, and in other embodiments, from about 0.1% to about 5% by weight of the resin composition. In a further embodiment, the amount of cationic photoinitiator is from about 0.2 wt % to about 4 wt % of the total resin composition, and in other embodiments from about 0.5 wt % to about 3 wt %.

In some embodiments, depending on the wavelength of light used for curing the liquid radiation curable resin, it is desirable for the liquid radiation curable resin composition to include a photosensitizer. The term "photosensitizer" is used to refer to any substance that either increases the rate of photoinitiated polymerization or shifts the wavelength at which polymerization occurs; see textbook by G. Odian, Principles of Polymerization, $3^{rd}$ Ed., 1991, page 222. A variety of compounds can be used as photosensitizers, including heterocyclic and fused-ring aromatic hydrocarbons, organic dyes, and aromatic ketones. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl-methanone, isopropyl-9H-thioxanthen-9-one, 1-pyrenemethanol, 9-(hydroxymethyl) anthracene, 9,10-diethoxyanthracene, 9,10-dimethoxyanthracene, 9,10-dipropoxyanthracene, 9,10-dibutyloxyanthracene, 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate (Darocur MBF from BASF), methyl-2-benzoyl benzoate (Chivacure OMB from Chitec), 4-benzoyl-4'-methyl diphenyl sulfide (Chivacure BMS from Chitec), 4,4'-bis(diethylamino)benzophenone (Chivacure EMK from Chitec), and any combination thereof.

The novel mixtures may also contain various photoinitiators of different sensitivity to radiation of emission lines with different wavelengths to obtain a better utilization of a UV light source. The use of known photoinitiators of different sensitivity to radiation of emission lines is well known in the art of additive fabrication, and may be selected in accordance with radiation sources of, for example, 351, nm 355 nm, 365 nm, 385 nm, and 405 nm. In this context it is advantageous for the various photoinitiators to be selected such, and employed in a concentration such, that equal optical absorption is produced with the emission lines used.

The liquid radiation curable resin composition for additive fabrication can include any suitable amount of the photosensitizer, for example, in certain embodiments, in an amount up to about 10% by weight of the resin composition, in certain embodiments, up to about 5% by weight of the resin composition, and in further embodiments from about 0.05% to about 2% by weight of the resin composition.

Free-Radical Photoinitiator

Typically, free radical photoinitiators are divided into those that form radicals by cleavage, known as "Norrish Type I" and those that form radicals by hydrogen abstraction, known as "Norrish type II". The Norrish type II photoinitiators require a hydrogen donor, which serves as the free radical source. As the initiation is based on a bimolecular reaction, the Norrish type II photoinitiators are generally slower than Norrish type I photoinitiators which are based on the unimolecular formation of radicals. On the other hand, Norrish type II photoinitiators possess better optical absorption properties in the near-UV spectroscopic region. Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a liquid radiation curable resin for additive fabrication, it is necessary to review the wavelength sensitivity of the photoinitiator(s) present in the resin composition to determine if they will be activated by the radiation source chosen to provide the curing light.

In accordance with an embodiment, the liquid radiation curable resin for additive fabrication includes at least one free radical photoinitiator, e.g., those selected from the group consisting of benzoylphosphine oxides, aryl ketones, benzophenones, hydroxylated ketones, 1-hydroxyphenyl ketones, ketals, metallocenes, and any combination thereof.

In an embodiment, the liquid radiation curable resin for additive fabrication includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl)phenyl]-1-butanone, 2-dimethylamino-2-(4-methyl-benzyl)-1-(4-morpholin-4-yl-phenyl)-butan-1-one, 4-benzoyl-4'-methyl diphenyl sulfide, 4,4'-bis(diethylamino)benzophenone, and 4,4'-bis(N,N'-dimethylamino)benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl) ketone, 2-hydroxy-1-[4-(2-hydroxyethoxy)phenyl]-2-methyl-1-propanone, 4-isopropylphenyl (1-hydroxyisopropyl) ketone, oligo-[2-hydroxy-2-methyl-1-[4-(1-methylvinyl)phenyl] propanone], camphorquinone, 4,4'-bis(diethylamino)benzophenone, benzil dimethyl ketal, bis (eta 5-2-4-cyclopentadien-1-yl)bis[2,6-difluoro-3-(1H-pyrrol-1-yl)phenyl] titanium, and any combination thereof.

For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl)phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulfide (Chivacure BMS from Chitec), 4,4'-bis(diethylamino)benzophenone (Chivacure EMK from Chitec), and 4,4'-bis(N,N'-dimethylamino) benzophenone (Michler's ketone). Also suitable are mixtures thereof.

Additionally, photosensitizers are useful in conjunction with photoinitiators in effecting cure with LED light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulfide (Chivacure BMS from Chitec), 4,4'-bis(diethylamino) benzophenone (Chivacure EMK from Chitec).

It is possible for UV radiation sources to be designed to emit light at shorter wavelengths. For light sources emitting at wavelengths from between about 100 and about 300 nm, it is possible to employ a photosensitizer with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, dimethoxybenzophenone, and 1-hydroxyphenyl ketones, such as 1-hydroxycyclohexyl phenyl ketone, phenyl (1-hydroxyisopropyl) ketone, 2-hydroxy-1-[4-(2-hroxyethoxy)phenyl]-2-methyl-1-propanone, and 4-isopropylphenyl (1-hydroxyisopropyl) ketone, benzil dimethyl ketal, and oligo-[2-hydroxy-2-methyl-1-[4-(1-methylvinyl)phenyl] propanone](Esacure KIP 150 from Lamberti).

Radiation sources can also be designed to emit at higher wavelengths. For radiation sources emitting light at wavelengths from about 475 nm to about 900 nm, examples of suitable free radical photoinitiators include: camphorquinone, 4,4'-bis(diethylamino) benzophenone (Chivacure EMK from Chitec), 4,4'-bis(N,N'-dimethylamino) benzophenone (Michler's ketone), bis(2,4,6-trimethylbenzoyl)-phenylphosphineoxide ("BAPO," or Irgacure 819 from Ciba), metallocenes such as bis (eta 5-2-4-cyclopentadien-1-yl) bis[2,6-difluoro-3-(1H-pyrrol-1-yl)phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

In one embodiment of the instant claimed invention, the light emitted by the radiation source is UVA radiation, which is radiation with a wavelength between about 320 and about 400 nm. In one embodiment of the instant claimed invention, the light emitted by the radiation source is UVB radiation, which is radiation with a wavelength between about 280 and about 320 nm. In one embodiment of the instant claimed invention, the light emitted by the radiation source is UVC radiation, which is radiation with a wavelength between about 100 and about 280 nm.

The liquid radiation curable resin for additive fabrication can include any suitable amount of the free-radical photoinitiator as component (d), for example, in certain embodiments, in an amount up to about 10 wt % of the resin composition, in certain embodiments, from about 0.1 to about 10 wt % of the resin composition, and in further embodiments from about 1 to about 6 wt % of the resin composition.

Fillers

The liquid radiation curable composition for additive fabrication according to the present invention also comprises at least one filler. Inorganic substances are especially preferred as fillers because of their tendency to impart water-resistance, heat-resistance, and robust mechanical properties into the cured, solid three-dimensional parts made therefrom.

In an embodiment, a filler of which the particles are spherical-herein defined as having a sphericity of 0.80 or greater-is used, because of the improved molding properties and accuracy they impart into three dimensional objects made of the prepared resin composition of the present invention.

In an embodiment of the invention, the filler is inorganic and comprises ceramics such as silica ($SiO_2$) nanoparticles, i.e., those particles having a mean particle size of from between 1 nanometer (nm) to 999 nm, or microparticles, i.e., those particles having a mean particle size of between 1 micrometer ($\mu m$) to 999 $\mu m$. Average particle size may be measured using laser diffraction particle size analysis in accordance with ISO13320:2009. A suitable device for measuring the average particle diameter of nanoparticles is the LB-550 machine, available from Horiba Instruments, Inc, which measures particle diameter by dynamic light scattering.

The nanoparticles or microparticles may be substantially silica based powders, for instance, greater than 85 wt %, more preferably 90 wt %, more preferably 95 wt % of silica ($SiO_2$). Certain non-limiting examples of commercially available silica powder products include Crystallite 3K-S, Crystallite NX-7, Crystallite MCC-4, Crystallite CMC-12, Crystallite A-1, Crystallite AA, Crystallite C, Crystallite D, Crystallite CMC-1, Crystallite C-66, Crystallite 5X, Crystallite 2A-2, Crystallite VX-S2, Crystallite VX-SR, Crystallite VX-X, Crystallite VX-S, HUSELEX RD-8, HUSELEX RD-120, HUSELEX MCF-4, HUSELEX GP-200T, HUSELEX ZA-30, HUSELEX RD-8, HUSELEX Y-40, HUSELEX E-2, HUSELEX Y-60, HUSELEX E-1, HUSELEX E-2, HUSELEX FF, HUSELEX X, HUSELEX ZA-20, IMSIL A-25, IMSIL A-15, IMSIL A-10, and IMSIL A-8, (Ryushin Co., Ltd.); ORGANOSILICASOLT MEK-EC-2102, ORGANOSILICASOL™ MEK-EC-2104, ORGANOSILICASOL™ MEK-AC-2202, ORGANOSILICASOL™ MEK-AC-4101, ORGANOSILICASOL™ MEK-AC-5101, ORGANOSILICASOL™ MIBK-SD, ORGANOSILICASOL™ MIBK-SD-L, ORGANOSILICASOL™ DMAC-ST, ORGANOSILICASOL™ EG-ST, ORGANOSILICASOL™ IPA-ST, ORGANOSILICASOL™ IPA-ST-L, ORGANOSILICASOL™ IPA-ST-L-UP, ORGANOSILICASOL™ IPA-ST-ZL, ORGANOSILICASOL™ MA-ST-M, ORGANOSILICASOL™ MEK-ST, ORGANOSILICASOL™ MEK-ST-L, ORGANOSILICASOL™ MEK-ST-UP, ORGANOSILICASOL™ MIBK-ST, ORGANOSILICASOL™ MT-ST, ORGANOSILICASOL™ NPC-ST-30, ORGANOSILICASOL™ PMA-ST, SUNSPHERE H-31, SUNSPHERE H-32, SUNSPHERE H-51, SUNSPHERE H-52, SUNSPHERE H-121, SUNSPHERE H-122, SUNSPHERE L-31, SUNSPHERE L-51, SUNSPHERE L-121, SUNSPHERE NP-30, SUNSPHERE NP-100, and SUNSPHERE NP-200 (Asahi Glass Co., Ltd.); Silstar MK-08 and MK-15 (Nippon Chemical Industrial Co., Ltd.); FB-48 (Denki Kagaku Kogyo K.K.); Nipsil SS-10, Nipsil SS-15, Nipsil SS-10A, Nipsil SS-20, Nipsil SS-30P, Nipsil SS-30S, Nipsil SS-40, Nipsil SS-50, Nipsil SS-50A, Nipsil SS-70, Nipsil SS-100, Nipsil SS-1OF, Nipsil SS-50F, Nipsil SS-50B, Nipsil SS-50C, Nipsil SS-72F, Nipsil SS-170X, Nipsil SS-178B, Nipsil E150K, Nipsil E-150J, Nipsil E-1030, Nipsil ST-4, Nipsil E-170, Nipsil E-200, Nipsil E-220, Nipsil E-200A, Nipsil E-1009, Nipsil E-220A, Nipsil E-1011, Nipsil E-K300, Nipsil HD, Nipsil HD-2, Nipsil N-300A, Nipsil L-250, Nipsil G-300, Nipsil E-75, Nipsil E-743, and Nipsil E-74P (Nippon Silica Industry, Ltd.). Please see U.S. Pat. No. 6,013,714 for further examples of silica particles.

In other embodiments of the invention, alternative inorganic filler substances may be used, such as those containing glass or metal particles. Certain non-limiting examples of such substances include: glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, oxidation titanium, aluminum powder, bronze, zinc powder, copper powder, lead powder, gold powder, silver dust, glass fiber, titanic acid potassium whiskers, carbon whiskers, sapphire whiskers, verification rear whiskers, boron carbide whiskers, silicon carbide whiskers, and silicon nitride whiskers.

Certain non-limiting examples of such other commercially available inorganic filler products include Glass bead GB210, GB210A, GB210B, GB210C, GB045Z, GB045ZA, GB045ZB, GB045ZC, GB731, GB731A, GB731B, GB731C, GB731M, GB301S, EGB210, EGB210A, EGB210B, EGB210C, EGB045Z, EGB045ZA, EGB045ZB, EGB045ZC, MB-10, MB-20, EMB-10, EMB-20, HSC070Q, HSC-024X, HSC-080S, HSC-070G, HSC-075L, HSC-110, HSC-110A, HSC-110B, and HSC-110C (Toshiba Balotini Co., Ltd.); Radiolite #100, Radiolite Fine Flow B, Radiolite Fine Flow A, Radiolite Sparkle Flow, Radiolite Special Flow, Radiolite #300, Radiolite #200, Radiolite Clear Flow, Radiolite #500, Radiolite #600, Radiolite #2000, Radiolite #700, Radiolite #500S, Radiolite #800, Radiolite #900, Radiolite #800S, Radiolite #3000, Radiolite Ace, Radiolite Superace, Radiolite High Ace, Radiolite PC-1, Radiolite Delux P-5, Radiolite Delux W50, Radiolite Microfine, Radiolite F, Radiolite SPF, Radiolite GC, Topco #31, Topco #34, Topco #36, Topco #38, and Topco #54(Showa Chemical Industry Co., Ltd.); Higilite H-X, Higilite H-21, Higilite H-31, Higilite H-32, Higilite H-42, Higilite H-42M, Higilite H-43, Higilite H-32ST, Higilite H-42STV, Higilite H-42T, Higilite H-34, Higilite H-34HL, Higilite H-321, Higilite H-42I, Higilite H-42S, Higilite H-210, Higilite H-310, Higilite H-320, Higilite H-141, Higilite H-241, Higilite H-341, Higilite H-3201, Higilite H-320ST, Higilite HS-310, Higilite HS-320, Higilite HS-341, Alumina A-426, Alumina A-42-1, Alumina A-42-2, Alumina A-42-3, Alumina A-420, Alumina A-43M, Alumina A-43-L, Alumina A-50-K, Alumina A-50-N, Alumina A-50-F, Alumina AL-45-H, Alumina AL-45-2, Alumina AL-45-1, Alumina AL-43-M, Alumina AL-43-L, Alumina AL-43PC, Alumina AL-150SG, Alumina AL-170, Alumina A-172, Alumina A-173, Alumina AS10, Alumina AS-20, Alumina AS-30, Alumina AS-40, and Alumina AS-50 (Showa Denko K.K.); Starmague U, Starmague M, Starmague L, Starmague P, Starmague C, Starmague CX, High purity magnesia HP-10, High purity magnesia HP-10N, High purity magnesia HP-30, Star brand-200, Star brand-10, Star brand-10A, Star brand magnesium carbonate Venus, Star brand magnesium carbonate two stars, Star brand magnesium carbonate one star, Star brand magnesium carbonate S, Star brand magnesium carbonate Fodder, Star brand heavy magnesium carbonate, High purity magnesium carbonate GP-10, High purity magnesium carbonate 30, Star brand light calcium carbonate general use, Star brand light calcium carbonates EC, and Star brand light calcium carbonate KFW-200 (Konoshima Chemical Industry Co., Ltd.); MKC Silica GS50Z and MKC Silica SS-15 (Mitsubishi Chemical Corp.), Admafine SOE-E3, Admafine SO—$C_3$, Admafine AO-800, Admafine AO-809, Admafine AO-500, and Admafine AO-509 (Adomatex Co., Ltd.); M. S. GEL D-560A, M. S. GEL D-5120A, M. S. GEL D-5300A, M. S. GEL D-2060A, M. S. GEL D-20120A, M. S. GEL D-20-300A, SILDEX H-31, SILDEX H-32, SILDEX H-51, SILDEX H-52, SILDEX H-121, SILDEX H-122, SILDEX L-31, SILDEX L-51, SILDEX L-121, SILDEX F-51, and SILDEX F-121 (Asahi Glass); SYLYSIA 250, SYLYSIA 250N, SYLYSIA 256, SYLYSIA 256N, SYLYSIA 310, SYLYSIA 320, SYLYSIA 350, SYLYSIA 358, SYLYSIA 430, SYLYSIA 431, SYLYSIA 440, SYLYSIA 450, SYLYSIA 470, SYLYSIA 435, SYLYSIA 445, SYLYSIA 436, SYLYSIA 446, SYLYSIA 456, SYLYSIA 530, SYLYSIA 540, SYLYSIA 550, SYLYSIA 730, SYLYSIA 740, SYLYSIA 770, SYLOPHOBIC100, and SYLOPHOBIC 200 (Fuji Silysia Chemical Co., Ltd.); and Tismo-D, Tismo-L, Tofica Y, Tofica YN, Tofica YB, Dendol WK-200, Dendol WK-200B, Dendol WK-300, Dendol BK-200, Dendol BK-300, Swanite, and Barihigh B Super Dendol (Otsuka Chemical Co., Ltd.).

The inorganic fillers may also be surface treated with a silane coupling agent. Silane coupling agents which can be used for this purpose include vinyl trichlorosilane, vinyl tris(β-methoxyethoxy) silane, vinyltriethoxy silane, vinyltrimethoxy silane, γ-(methacryloxypropyl) trimethoxy silane, β-(3,4-epoxycyclohexyl) ethyltrimethoxy silane, γ-glycydoxypropyltrimethoxy silane, γ-glycydoxypropylmethyl diethoxy silane, N-β (aminoethyl) aminopropyltrimethoxy silane, N-β-(aminoethyl)-γ-aminopropylmethyldimethoxy silane, γ-aminopropyltriethoxysilane, N-phenyl-γ-amino propyl trimethoxy silane, γ-mercaptopropyl trimethoxysilane, and γ-chloropropyltrimethoxy silane.

The condition of the surface of the particles of the filler used and the impurities contained in filler from the fabrication process can affect the curing reaction of the resin composition. In such cases, it is preferable to wash the filler particles or coat the particles with an appropriate primer as a method of improving the curing properties. The inventors have also noted that certain fillers tend to contribute to a particularly marked reduction in viscosity stability. Without wishing to be bound by any particular theory, a hypothesized cause for this phenomenon is the presence of residual acids present amongst the particles of such fillers, which are an unwanted but often unavoidable byproduct of the manufacturing process used to create them. These residual acids will react with cationically polymerizable components in the surrounding resin, resulting in partial polymerization and an increase in viscosity over time.

The liquid radiation curable resin for additive fabrication can include any suitable amount of inorganic filler or combination of fillers as component (e), for example, in an amount up to about 80 wt % of the resin composition, in certain embodiments from about 30 to about 80 wt % of the resin composition, and in further embodiments from about 50 to about 70 wt % of the resin composition. If the amount of the component (e) is too small, the water and heat resistant properties, durability, and structural rigidity of the molds made of the prepared resin composition do not increase sufficiently. On the other hand, if the amount of the component (e) is too large, the fluidity of the prepared resin composition becomes too low, rendering it difficult or even un-workable in additive fabrication processes. The excessive amount of the component (e) can also affect the time needed for radiation curing of the resin composition, causing the processing time to increase substantially.

Light Absorbing Components

As used herein, "light absorbing components" include those components which are added to a formulation to increase the amount of light absorbed by the entire composition at a certain wavelength, and which are not already characterized as a photoinitiator or photosensitizer.

Three technical approaches were invented to reduce surface reflection of the high intensity green laser by increasing the absorption at 532 nm. This is a hypothetical method to increase the efficiency of SL composites in the PIV test. Color additives were added into SL resins to make colored SL parts where the 532 nm green laser beam was absorbed on the top surface. Once the green laser hit the surface, the intensity of laser was immediately reduced so much that it was enough to reduce surface reflection, allowing more accurate data collection very close to the surface. The feasible additives in SL resins may include pigments, laser dyes (or visible light absorbers), and photochemical latent dyes. Black pigments, dyes, or other fillers effectively absorb the desired wavelength but also block all UV-visible light, especially the curing laser at 355 nm. Therefore, the additives should meet three requirements: 1) Strong absorption around 532 nm with low or zero fluorescent emission around 532 nm; 2) Lower or no absorption around 355 nm, the wavelength used to cure many SL resins; 3) It does not inhibit or significantly decrease the curing speed of SL resins.

In embodiments, any suitable organic salt light absorber, including photochemical latent dyes, and/or laser dyes meeting the above criteria may be incorporated for use in compositions of the current invention. The specific identify of the light absorber(s) used will depend upon the AF and PIV wavelengths with which the composition (or the part cured therefrom) will be associated.

1) Addition of pigment, for example our internally-formulated lithol red salt dispersion (V 952), provided a good absorption peak at 532 nm with a slight decline of curing speed.

2) Addition of photochemical latent dye, for example Copikem magenta, gave a better absorption at 532 nm but sharply slowed down curing speed as the concentration of this cyclic lactone dye precursor increased. The acidified Copikem magenta-SbF$_6$ salt demonstrated much better curing speed without compromising 532 nm absorption.

3) Addition of laser dye, for example Rhodamine 6G, showed the highest 532 nm absorption among three approaches, but curing speed moderately decreased as this laser dye concentration increased. The modified Rhodamine 6G-SbF$_6$ salt became the best candidate to provide the high 532 nm absorption without compromising cure speed. PIV testing performed has confirmed that each of the three technical approaches worked very well and were even better than the current solution of painted SL parts. Any combination of the two or three technical approaches may work as well.

In an embodiment, the light absorbing component comprises a compound defined by the following formula (III):

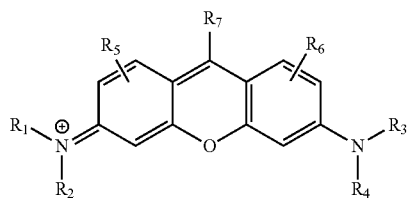

wherein $R_1$, $R_2$, $R_3$, $R_4$, $R_5$, and $R_6$, each independently represents a hydrogen atom, a substituted methyl or alkyl group, or an un-substituted methyl or alkyl group; and $R_7$ represents an un-substituted phenyl group or a substituted phenyl group. In a preferred embodiment $R_7$ represents a benzoic ester group. In such case, the compound defined by formula (III) is called a fluorescein or rhodamine. The specific identify of the methyl or alkyl substituents $R_1$, $R_2$, $R_3$, $R_4$, $R_5$ and $R_6$ may be tailored as desired because such substituents are not expected to have a significant impact upon the optical properties or absorbance of the dye with which they are associated.

In a preferred embodiment, the light absorbing component comprises a xanthene or rhodamine dye. Rhodamine dyes are known and are described in, i.a., U.S. Pat. Nos. 3,708,499, 3,767,358, and 3,849,065, each of which is hereby incorporated by reference in its entirety. A non-limiting listing of commercially available such dyes include Rhodamine 110, Rhodamine 6G, and Rhodamine B. Such dyes have the following molecular structures:

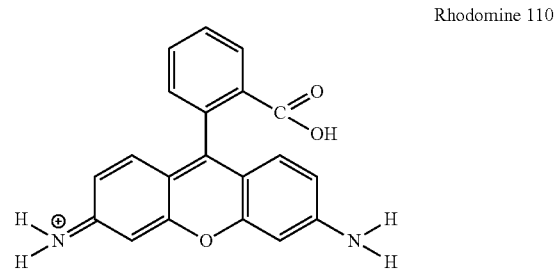

Rhodamine 110

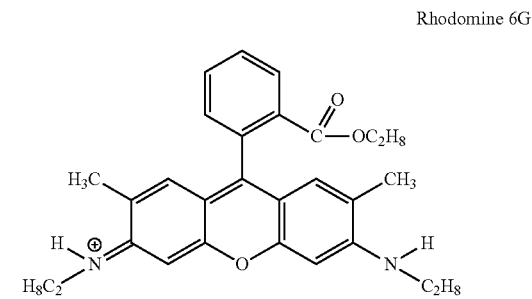

Rhodamine 6G

Rhodomine 8

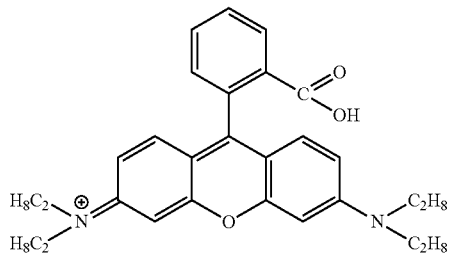

Inventors have discovered that although several known dyes, pigments, and other light absorbers described herein may be utilized effectively to impart sufficiently high desired absorbance values at the certain wavelength(s) of light used in particle image velocimetry tests, they similarly impart exceptionally high absorbance at the wavelength(s) of light used in the additive manufacturing processes required to convert them to test components. Because of this universally-high absorbance, light of all wavelengths-including the wavelength required to initiate the polymerization process-is prevented from penetrating the resin to sufficient depths. This has the effect of increasing the build time required for additive fabrication, either by necessitating a slower machine scanning speed, a smaller layer thickness, or both. In extreme cases, compositions with excessive absorbance values (at the relevant curing wavelength, at least) preclude the ability to create three-dimensional components via the additive fabrication processes entirely. Of course, the absorbance at the wavelength(s) used in the additive fabrication build process must not be too low, either, as in such case the material will not polymerize or yield cured objects at all. Inventors have surprisingly discovered that it is possible to synthesize and customize light absorbing components such that the radiation curable composition into which they are incorporated is specifically tailored and optimized simultaneously to: (1) maximize the absorbance of the three-dimensional component cured therefrom at the wavelength of light used in PIV testing, (2) limit the absorbance of the liquid radiation curable composition at the wavelength of light used in the additive manufacturing process itself, and (3) limit the cationic polymerization "chilling" effect by increasing acidity.

In an embodiment, the composition is configured such that it (or alternatively the test component cured therefrom) possesses an absorbance at a wavelength at which the light source in the particle image velocimetry test operates that is at least 10, or at least 15, or at least 20, or at least 25, or at least 30, or from 10-1000, or from 15-500, or from 20-200, or from 25-150, or from 30-100, or from 30-80, or from 35-75.

In an embodiment, the composition is also configured such that it (or alternatively the test component cured therefrom) possesses an absorbance at a wavelength at which the light source in the additive fabrication process operates that is less than 100, or less than 80, or less than 60, or less than 50, or less than 45, or at least 25, or at least 35, or at least 39, or from 25-100, or from 25-80, or from 25-60, or from 25-50, or from 25-45, or from 35-100, or from 35-80, or from 35-60, or from 35-45, or from 35-50, or from 39-100, or from 39-80, or from 39-60, or from 39-50, or from 39-45.

In a preferred embodiment, the composition is also configured (or alternatively the test component cured therefrom) such that the difference in absorbance between the peak wavelength at which the light source in the particle image velocimetry test operates and the peak wavelength at which the light source in the additive fabrication process operates is greater than-50, or greater than −40, or greater than-30, or greater than-20, or greater than-10, or greater than 0, or greater than 10, or greater than 20, or greater than 30, or greater than 50, or greater than 100, or greater than 150, or less than 200, or less than 150, or less than 100, or less than 50, or less than 30, or less than 20, or less than 10, or less than 0, or less than-10, or less than-20, or from about −50 to 200, or from about −40 to 200, or from about −30 to about 200, or from about −30 to about 150, or from about −30 to about 100, or from about −30 to about 80, or from about −30 to about 60, or from about −30 to about 30, or from about −30 to about 20, or from about −30 to about 10, or from about −30 to about 0, or from about −30 to about −10, or from about −20 to about 100, or from about −20 to about 80, or from about −20 to about 60, or from about −20 to about 30, or from about −20 to about 20, or from about −20 to about 10, or from about −20 to about 0, or from about −20 to about −10, or from about −10 to about 100, or from about −10 to about 80, or from about −10 to about 60, or from about −10 to about 30, or from about −10 to about 20, or from about −10 to about 10, or from about −10 to about 0.

In other preferred embodiments, the composition is also configured (or alternatively the test component cured therefrom) such that the difference in absorbance between the peak wavelength at which the light source in the particle image velocimetry test operates and the peak wavelength at which the light source in the additive fabrication process operates is between 0 and 150, or between 0 and 100, or between 0 and 50, or between 0 and 30, or between 10 and 150, or between 10 and 100, or between 10 and 50, or between 20 and 200, or between 20 and 100, or between 20 and 50.

In an embodiment, therefore, the composition comprises a light absorbing component that is modified to maximize absorbance at the wavelength to be used in PIV testing, and to minimize absorbance at the wavelength used in the additive fabrication process. In a preferred embodiment, particularly where the additive fabrication process is carried out using conventional additive fabrication light sources imparting radiation at 355 nm or 365 nm, and the PIV test is carried out using a laser emitting light at 532 nm, the light absorber is a fluoroantimony-modified compound. This compound is distinct from the associated the cationic photoinitiator, which is often fluoroantimony-based in such additive processes incorporating cationically polymerizable constituents. In an embodiment, the fluoroantimony-modified compound is a $SbF_6$-modified pigment, a $SbF_6$-modified laser dye, or a triarylmethane cationic dye.

In an embodiment, the light absorbing component comprises a compound defined by the following formula (IV):

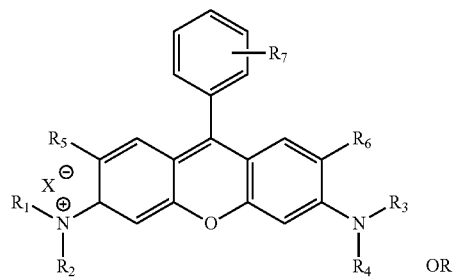

OR

-continued

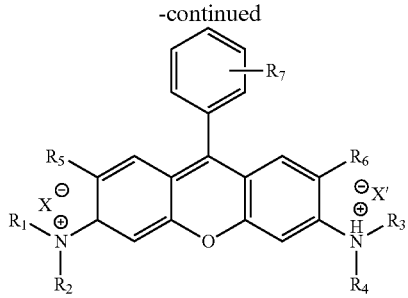

wherein

X and X' represents Cl⁻, Br⁻, I, $SO_4^{2-}$, $NO_3^-$, $ClO_4$, $AsF_6$, $SbF_6$, $PF_6$, $BF_4$, $(CF_3CF_2)3PF_3$, $(C_6F_5)_4B$, $((CF_3)_2C_6H_3)_4B$, $(C_6F_5)_4Ga$, $((CF_3)_2C_6H_3)_4Ga$, trifluoromethanesulfonate, nonafluorobutanesulfonate, methanesulfonate, butanesulfonate, benzenesulfonate, or p-toluenesulfonate;

$R_1$, $R_2$, $R_3$, $R_4$, $R_5$ and $R_6$ each independently represent a hydrogen atom, a substituted methyl or alkyl group, or an un-substituted methyl or alkyl group; and $R_7$ represents a hydrogen atom, an un-substituted phenyl group, or a substittued phenyl group.

In an embodiment, X or X' of formula (IV) represents Cl⁻, Br⁻, I⁻, $SO_4^{2-}$, $NO_3^-$, $ClO_4^-$, $AsF_6^-$, $SbF_6^-$, or $PF_6^-$, and preferably a hexafluoroantimony ($SbF_6$) ion.

X or X' per formula (IV) may be tuned such that it matches the anion of the accompanying cationic photoinitiator. It is believed that matching the ions of the cationic photoinitiator and the modified light absorbing component facilitates rapid curing at the wavelength at which the additive fabrication process is carried out. In an embodiment, therefore the anion of the cationic photoinitiator is also represented by X or X' per formula (IV).

The above-listed light absorbing components can be used alone or in combinations of two or more. The radiation curable composition for additive fabrication can include any suitable amount or combination of light absorbing components listed above, for example, in an amount, relative to the weight of the entire composition, of up to about 25 wt. %, or up to about 10 wt. %, or up to about 5%, or greater than 0.005 wt. %, or greater than 0.01 wt. %, or greater than 0.1 wt. %, or greater than 0.5 wt. %, or greater than 1 wt. %, or from 0.005 wt % to about 5 wt %, or from 0.01 wt. % to about 5 wt. %, or from 0.005 wt. % to about 0.5 wt %.

Stabilizers and Other Additives

Stabilizers are often added to the resin compositions in order to further prevent a viscosity build-up, for instance a viscosity build-up during usage in a solid imaging process. Useful stabilizers include those described in U.S. Pat. No. 5,665,792, the entire disclosure of which is hereby incorporated by reference. In the instant claimed invention, the presence of a stabilizer is optional. In a specific embodiment, the liquid radiation curable resin composition for additive fabrication comprises from 0.1 wt % to 3% of a stabilizer.

If present, such stabilizers are usually hydrocarbon carboxylic acid salts of group IA and IIA metals. Most preferred examples of these salts are sodium bicarbonate, potassium bicarbonate, and rubidium carbonate. Solid stabilizers are generally not preferred in filled resin compositions. If present, a 15~23% sodium carbonate solution is preferred for formulations of this invention with recommended amounts varying between 0.05 to 3.0% by weight of resin composition, more preferably from 0.05 to 1.0 wt %, more preferably from 0.1 to 0.5% by weight of resin composition. Alternative stabilizers include polyvinylpyrrolidones and polyacrylonitriles.

Other possible additives include dyes, pigments, antioxidants, wetting agents, photosensitizers for the free-radical photoinitiator, chain transfer agents, leveling agents, defoamers, surfactants and the like.

The liquid radiation curable resin composition for additive fabrication of the invention can further include one or more additives selected from the group consisting of bubble breakers, antioxidants, surfactants, acid scavengers, pigments, dyes, thickneners, flame retardants, silane coupling agents, ultraviolet absorbers, resin particles, core-shell particle impact modifiers, soluble polymers and block polymers.

To be effective in wind tunnel applications, in an embodiment the filled composition is able to impart sufficient strength and stiffness into the three dimensional solid objects which they form upon curing. Therefore, it is preferred that liquid radiation curable compositions for additive fabrication according to the present invention have a flexural modulus, after full cure with actinic radiation and a 60 minute UV and thermal postcure according to processes well-known in the art of additive fabrication and stereolithography (ASTM D648-98c), of at least 6,000 MPa, more preferably at least about 8,000 MPa, and even more preferably at least about 10,000 MPa. In an embodiment of the present invention, the flexural modulus achieved is between about 8,000 MPa and about 12,000 MPa.

Additionally, the filled composition must be able to impart sufficient resilience and integrity into three dimensional solid objects which they form upon curing, even after exposure to high heat conditions. Thus, it is preferred that the liquid radiation curable composition for additive fabrication according to the present invention, after full cure with actinic radiation and 60 minute UV and thermal postcure according to processes well-known in the art of additive fabrication and stereolithography (ASTM D648-98c), has a heat distortion temperature at 1.82 MPa of at least about 80 degrees Celsius, more preferably at least about 100 degrees Celsius, and more preferably at least about 110 degrees Celsius. In an embodiment of the present invention, the heat distortion temperature at 1.82 MPa is between about 80 degrees Celsius and about 120 degrees Celsius.

The fourth aspect of the claimed invention is the three-dimensional object formed from the liquid radiation curable resin of any one of the first three aspects of the present invention, by the any of the processes described or claimed herein.

The following examples further illustrate the invention but, of course, should not be construed as in any way limiting its scope.

EXAMPLES

These examples illustrate embodiments of the liquid radiation curable resins for additive fabrication of the instant invention. Table 1 describes the various components of the liquid radiation curable resins for additive fabrication used in the present examples.

TABLE 1

| Component | Function in Formula | Chemical Descriptor | Supplier/Manufacturer |
|---|---|---|---|
| Somos® PerFORM | Base resin (filled) | Proprietary blend of 25-50% silica particles, 15-35% epoxy, 2.1-11% multifunctional acrylate, 1-5% cationically curable monomer, 1-5% cationic photoinitiator, 1-5% free radical photoinitiator, | DSM |
| Somos® Protogen 18120 | Base resin (clear) | Proprietary blend of 50-75% cationically curable monomers, 10-25% multifunctional acrylate, 5-20% polyol, 1-5% cationic photoinitiator, 1-5% free-radical photoinitiator, <5% additives | DSM |
| Cablelite® 0483-55P Red Dispersion (V952) | Pigment | 15-20% calcium 3-hydroxy-4-[(4-methyl2-sulphonatophenyl)azo]-2-naphthoate dispersed in acrylate resin | DSM Resins |
| Rhodamine 6G | Laser dye | | |
| Rhodamine B | Laser dye | | |
| Custom Laser Dye 1 | Custom laser dye | $SbF_6$-Modified Rhodamine 6G | |
| Custom Laser Dye 2 | Custom laser dye | $SbF_6$-Modified Rhodamine B | |
| COPIKEM® 14 Orange | Cyclic lactone dye precursor | substituted phthalide | Hilton Davis Company |
| COPIKEM® 35 Magenta | Cyclic lactone dye precursor | 3-[Butyl-2-methylindol-3-yl]-3-(1-octyl-2-methylindol-3-yl)-1(3H)isobenzofuranone | Hilton Davis Company |
| Custom Cyclic Lactone Dye Precursor 1 | Custom cyclic lactone dye precursor | $SbF_6$-Modified Copikem Orange | |
| Custom Cyclic Lactone Dye Precursor 2 | Custom cyclic lactone dye precursor | $SbF_6$-Modified Magenta | |
| Custom Cyclic Lactone Dye Precursor 3 | Custom cyclic lactone dye precursor | Cl-Modified Magenta | |

Examples

Various filled liquid radiation curable resins for additive fabrication were prepared according to well-known methods in the art, employing a hybrid cure photoinitiating package, a cationically polymerizable package, a radically polymerizable package, and select additives. The compositions relied upon a control "base" resin of Somos® PerFORM, whereas a multitude of various light absorbing components in varying quantities were included.

These samples were tested according to the methods for viscosity, physical property testing (including modulus and Tg), absorbance at three different wavelengths (532 nm, 405 nm, and 355 nm), as detailed further below. Additionally, where data is provided, the various compositions were evaluated according to a working curve measurement (to determine Critical Energy, Fc, and Depth of Penetration, Dp). Next, the cure speed of each composition was evaluated according to reacted epoxide and reacted acrylate parameters. Finally, the qualitative results of each sample according to the particle image velocimetry (PIV) test is described and reported below. The results are depicted in Table 3.

Viscosity

The viscosity of each sample was taken with an Anton Paar Rheoplus Rheometer (S/N 80325376) using a Z3/Q1 measuring cylinder (S/N 10571) with a 25 mm diameter. The temperature was set at 30° Celsius with a shear rate of 50 s-1. The rotational speed was set at 38.5 min-1. The measuring container was a H-Z3/SM cup (diameter 27.110 mm) which was filled with 21.4 grams of sample (enough to the spindle). Measurements were recorded in millipascal-seconds (mPa·s), but converted and reported herein as centipoise (cPs).

Physical Property Testing

Samples were built by viper SLA machine (S/N 03FB0244 or S/N 02FB0160) to the standard Type I dog-bone shape for tensile testing where the overall length is 6.5 inches, the overall width is 0.75 inch and the thickness is 0.125 inches and standard bar shape for the Flexural testing where the length is 5 inches, the overall width is 0.5 inch and the thickness is 0.125 inches. Samples were conditioned 7 days at 23° C. at 50% relative humidity. The tensile properties were tested according to the ASTM D638-10 test method. The flexural strength & modulus properties were tested according to the ASTM D 0790 test method. Both tests were performed on the 5G Sintech tensile tester (S/N 34359).

Working Curve Measurement

Working curve data (Ec, Dp, and E10) was prepared using a solid state laser operating at a wavelength of 354.7 nm in accordance with the below method.

The working curve is a measure of the photospeed of the particular material. It represents the relationship between the thickness of a layer of liquid radiation curable resin produced as a function of the exposure given. For all formulations, the exposure-working curve of the formula is determined using methods well known in the art.

The exposure response for each formulation is measured using a 21.7 g sample of the formulation in a 100 mm diameter petri dish held at 30° C. and 30% RH. The surface of the formulation is exposed with the indicated light source. The exposures are made in half-inch squares (exposure regions) which are scanned out by drawing consecutive parallel lines approximately 25.4 microns apart on the surface of the liquid in the petri dish at 72 mW. Different exposure regions are exposed to different levels of known incident energy to obtain different cured thicknesses. The spot diameter at the liquid surface is approximately 0.0277 cm in diameter. After waiting at least 15 minutes for the exposed panels to harden, the panels are removed from the petri dish and excess, uncured resin is removed by blotting with a Kimwipe EX-L (Kimberly Clark). Film thickness is measured with a Mitutoyo Model ID-C 1 12CE Indicator Micrometer. Film thickness is a linear function of the natural logarithm of the exposure energy; the slope of the regression is Dp (units of micron or mil) and Ec is the x-axis intercept of the regression fit (units of mJ/cm$^2$). $E_{10}$ is the energy required to cure a ten mil (254 micron) layer.

Discussion of Results

These results demonstrate the superiority of compositions as described herein, in terms of simultaneous: suitability for producing cured components having adequate application-specific heat resistance and structural rigidity, a capability of producing parts that enable PIV testing with enhanced image resolution and without need for post-processing, and sufficient cure speed to ensure suitability in additive fabrication processes, such as stereolithography.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (espe-

TABLE 2

Amounts reported in parts by weight

| Internal ID # | PerFORM | V952 | Rhodamine 6G | Rhodamine B | Custom Laser Dye 1 | Custom Laser Dye 2 | COPIKEM® 14 Orange | COPIKEM® 35 Magenta | Custom Cyclic Lactone Dye Precursor 1 | Custom Cyclic Lactone Dye Precursor 2 | Custom Cyclic Lactone Dye Precursor 3 |
|---|---|---|---|---|---|---|---|---|---|---|---|
| Ctrl.(70) | 50 | | | | | | | | | | |
| C.1 (71) | 50 | | | | | | 0.030 | | | | |
| 72 | 50 | | | | | | | 0.0075 | | | |
| 73 | 50 | | | | | | | 0.015 | | | |
| 74 | 50 | | | | | | | 0.030 | | | |
| 75 | 50 | | | | | | | 0.060 | | | |
| 76 | 50 | 0.280 | | | | | | | | | |
| 77 | 50 | 0.140 | | | | | | | | | |
| 83 | 50 | | | | | | | | 0.015 | | |
| 84 | 50 | | | | 0.015 | | | | | | |
| 85 | 50 | | | | | 0.015 | | | | | |
| 86 | 50 | | | 0.015 | | | | | | | |
| 87 | 50 | | 0.015 | | | | | | | | |
| 88 | 50 | | | | | 0.030 | | | | | |
| 90 | 50 | | | | | | | | | 0.030 | |
| 82 | 50 | | | | | | | | | | 0.015 |
| 89 | 50 | | 0.030 | | | | | | | | |

TABLE 3

| Example | $A_{335\,nm}$ | $A_{405\,nm}$ | $A_{532\,nm}$ | Ec | Dp | Modulus (dogbone) | Tg (dogbone) | Reacted Epoxide (10.0 m) % | Reacted Acrylate (0.0083 m) % | Qualitative - Suitable in PIV test? |
|---|---|---|---|---|---|---|---|---|---|---|
| Ctr | 39.47 | 3.09 | 2.19 | 8.18 | 4.7 | No data | No data | 26.5 | 34.3 | FAIL |
| C.1 | 43.21 | 15.30 | 5.13 | Nd | Nd | Nd | Nd | 12.9 | 49.5 | FAIL |
| 72 | 40.62 | 4.14 | 10.87 | Nd | Nd | Nd | Nd | 26.2 | 51.1 | No data |
| 73 | 41.77 | 5.20 | 19.54 | Nd | Nd | Nd | Nd | 21.7 | 47.7 | No data |
| 74 | 44.06 | 7.31 | 36.89 | Nd | Nd | Nd | Nd | 9.3 | 49.6 | No data |
| 75 | 48.65 | 11.55 | 71.59 | Nd | Nd | Nd | Nd | 1.9 | 28.6 | No data |
| 76 | 54.14 | 18.98 | 35.93 | Nd | Nd | Nd | Nd | 28.6 | 41.4 | PASS |
| 77 | 46.81 | 11.04 | 19.06 | Nd | Nd | Nd | Nd | 30.7 | 45.8 | No data |
| 83 | 41.77 | 5.20 | 19.54 | Nd | Nd | Nd | Nd | 13.7 | 33.0 | PASS |
| 84 | 43.45 | 3.94 | 56.00 | 10.26 | 4.23 | Nd | Nd | 24.3 | 24.9 | PASS |
| 85 | 44.42 | 5.39 | 30.95 | Nd | Nd | Nd | Nd | 24.7 | 27.7 | PASS |
| 86 | 44.42 | 5.39 | 30.95 | Nd | Nd | Nd | Nd | 15.0 | 24.5 | PASS |
| 87 | 43.45 | 3.94 | 56.00 | 10.04 | 3.89 | Nd | Nd | 14.6 | 27.0 | PASS |
| 88 | 47.44 | 4.79 | 109.81 | 11 | 3.7 | Nd | Nd | 25.3 | 21.0 | PASS |
| 90 | 44.06 | 7.32 | 36.89 | Nd | Nd | Nd | Nd | 2.7 | 32.2 | PASS |
| 82 | 41.77 | 5.20 | 19.54 | Nd | Nd | Nd | Nd | 6.4 | 30.9 | No data |
| 89 | 47.44 | 4.79 | 198.81 | Nd | Nd | Nd | Nd | 7.8 | 19.5 | No data |

Nd = no data cially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A radiation curable composition for additive fabrication, comprising, relative to the weight of the entire composition:
    (a) from 25-65 wt. % of a filler constituent;
    (b) from 10-50 wt. % of a cationically polymerizable constituent;
    (c) from 5-40 wt. % of a free-radically polymerizable constituent;
    (d) from about 0.1 wt. % up to about 15 wt. % of a cationic photoinitiator;
    (e) from about 0.1 wt. % up to about 10 wt. % of a free-radical photoinitiator; and
    (f) an organic salt light absorbing component.

2. The radiation curable composition of claim 1, wherein the organic salt light absorbing component is an organic salt, preferably an ammonium salt.

3. The radiation curable composition of claim 1, wherein the organic salt light absorbing component is in accordance with the following formula (IV):

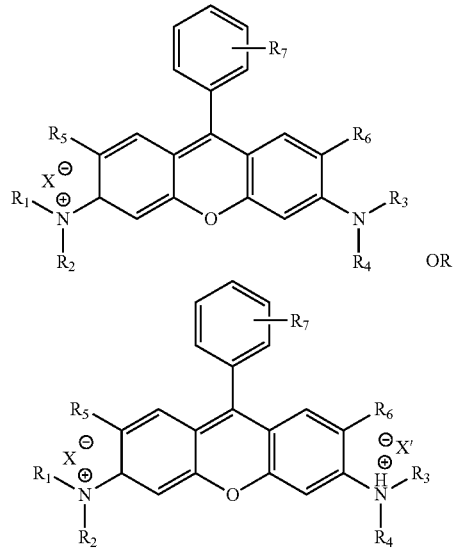

OR wherein
X and X' represents Cl$^-$, Br$^-$, I$^-$, SO$_4^{2-}$, NO$_3^{2-}$, ClO$_4^-$, AsF$_6^-$, SbF$_6^-$, PF$_6^-$, BF$_4^-$, (CF$_3$CF$_2$)$_3$PF$_3^-$, (C$_6$F$_5$)$_4$B$^-$, ((CF$_3$)$_2$C$_6$H$_3$)$_4$B$^-$, (C$_6$F$_5$)$_4$Ga$^-$, ((CF$_3$)$_2$C$_6$H$_3$)Ga$^-$, trifluoromethanesulfonate, nonafluorobutanesulfonate, methanesulfonate, butanesulfonate, benzenesulfonate, or p-toluenesulfonate; R$_1$, R$_2$, R$_3$, R$_1$, R$_5$ and R$_6$ each independently represent a hydrogen atom, a substituted methyl or alkyl group, or an un-substituted methyl or alkyl group; and R7 represents a hydrogen atom, an un-substituted phenyl group, or a substituted phenyl group.

4. The radiation curable composition of claim 3, wherein X or X' represents Cl$^-$, Br$^-$, I$^-$, SO$_4^{2-}$, NO$_3^-$, ClO$_4^-$, AsF$_6^-$, SbF$_6^-$, or PF$_6^-$, preferably wherein X or X' represents a hexafluoroantimony (SbF$_6$)$^{31}$ ion.

5. The radiation curable composition of claim 3, wherein the cationic photoinitiator further comprises an anion, wherein the anion is also defined by X or X'.

6. The radiation curable composition of claim 3, wherein the anion of the cationic photoinitiator possesses a moiety that is identical to the moiety of X or X' in the light absorbing component.

7. The radiation curable composition of claim 1, wherein the light absorbing component comprises a fluoroantimony counterion, and further wherein the light absorbing compound is different from (d).

8. The radiation curable composition of claim 1, further comprising a pigment.

9. The radiation curable composition of claim 1, wherein the filler constituent comprises a plurality of organic or inorganic microparticles or nanoparticles.

10. The radiation curable composition of claim 1, wherein the filler constituent consists of a combination inorganic microparticles and inorganic nanoparticles.

11. The radiation curable composition of claim 1, wherein the filler constituent consists essentially of a combination inorganic microparticles and inorganic nanoparticles.

12. The radiation curable composition of claim 11, wherein a weight ratio of the inorganic microparticles to the inorganic nanoparticles is from 1:1 to 12:1.

13. The radiation curable composition of claim 11, wherein the inorganic microparticles and the inorganic nanoparticles possess an average size, wherein a ratio of the average particle size of the inorganic microparticles to the average particle size of the inorganic nanoparticles is from 2.41:1 to less than 200:1, or from 2.41:1 to 100:1, or from 6.46:1 to less than 200:1, or from 6.46:1 to 100:1, wherein the average particle size of the inorganic microparticles and the inorganic nanoparticles is determined by ISO 13320: 2009.

14. The radiation curable composition of claim 11, wherein the average particle size of the inorganic nanoparticles is from 50 nanometers (nm) to 200 nm, or from 50 to 100 nm.

15. The radiation curable composition of claim 11, wherein the average particle size of the inorganic microparticles is from 2 microns to 8 microns.

16. The radiation curable composition of claim 1, further comprising from 0.001 wt. % to 0.5 wt. % of a stabilizer.

17. The radiation curable composition of claim 7, wherein a fluoroantimony-modified compound is an $SbF_6$-modified laser dye, or a modified triarylmethane cationic dye from a cyclic lactone precursor.

18. The radiation curable composition of claim 1, further comprising from 5 wt. % to 15 wt. % of an oxetane.

\* \* \* \* \*